(12) United States Patent
Noh

(10) Patent No.: US 10,186,529 B2
(45) Date of Patent: Jan. 22, 2019

(54) THIN FILM TRANSISTOR SUBSTRATE AND DISPLAY USING THE SAME

(71) Applicant: LG DISPLAY CO., LTD., Seoul (KR)

(72) Inventor: Soyoung Noh, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/248,667

(22) Filed: Aug. 26, 2016

(65) Prior Publication Data

US 2017/0062490 A1 Mar. 2, 2017

(30) Foreign Application Priority Data

Aug. 27, 2015 (KR) .................. 10-2015-0120902

(51) Int. Cl.
*H01L 27/12* (2006.01)

(52) U.S. Cl.
CPC ...... *H01L 27/1255* (2013.01); *H01L 27/1225* (2013.01); *H01L 27/1251* (2013.01)

(58) Field of Classification Search
CPC ............ H01L 27/1255; H01L 27/124; H01L 27/1225; H01L 27/1285; H01L 27/1288; H01L 27/1248; H01L 27/1251
See application file for complete search history.

(56) References Cited

U.S. PATENT DOCUMENTS

| | | | | |
|---|---|---|---|---|
| 2007/0120116 A1* | 5/2007 | Han | ............... | H01L 51/0541 257/40 |
| 2008/0225190 A1* | 9/2008 | Chen | ............ | G02F 1/136213 349/38 |
| 2012/0001191 A1* | 1/2012 | Ma | ............... | G02F 1/136213 257/71 |
| 2014/0183479 A1* | 7/2014 | Park | ............ | H01L 51/56 257/40 |
| 2015/0014681 A1 | 1/2015 | Yamazaki | | |

FOREIGN PATENT DOCUMENTS

CN 104867932 A1 8/2015

* cited by examiner

*Primary Examiner* — Asok K Sarkar
*Assistant Examiner* — Dmitriy Yemelyanov
(74) *Attorney, Agent, or Firm* — Dentons US LLP

(57) ABSTRACT

A display is disclosed which includes a substrate, a first thin film transistor, a second thin film transistor, a first storage capacitor electrode, an oxide layer, a nitride layer, a second storage capacitor electrode, a planar layer and a pixel electrode. The first thin film transistor is disposed in a first area on the substrate. The second thin film transistor is disposed in a second area on the substrate. The first storage capacitor electrode is disposed in a third area on the substrate. The oxide layer covers the first thin film transistor and the second thin film transistor, and exposes the first storage capacitor electrode. The nitride layer is disposed on the oxide layer and covers the first storage capacitor electrode. The second storage capacitor electrode includes a first metal layer and a second metal layer, and overlaps with the first storage capacitor electrode on the nitride layer. The planar layer covers the first thin film transistor, the second thin film transistor and the second storage capacitor electrode. The pixel electrode is disposed on the planar layer.

6 Claims, 4 Drawing Sheets

THIN FILM TRANSISTOR SUBSTRATE AND DISPLAY USING THE SAME

This application claims priority from and the benefit under 35 U.S.C. § 119(a) of Korea Patent Application No. 10-2015-0120902 filed on Aug. 27, 2015, which is incorporated herein by reference for all purposes as if fully set forth herein.

BACKGROUND OF THE INVENTION

Field of the Invention

The present disclosure relates to a thin film transistor substrate, a display including the same and a method of manufacturing the same.

Discussion of the Related Art

Nowadays, as the information society is developed, the requirements of displays for representing information are increasing. Accordingly, various flat panel displays (or 'FPD') are developed for overcoming many drawbacks of the cathode ray tube (or 'CRT') which is heavy and bulky. The flat panel display devices include a liquid crystal display device (or 'LCD'), a plasma display panel (or 'PDP'), an organic light emitting display device (or 'OLED') and an electrophoresis display device (or 'ED').

The display panel of a flat panel display may include a thin film transistor substrate having a thin film transistor allocated in each pixel region arrayed in a matrix manner. For example, an LCD displays images by controlling the light transmissivity of the liquid crystal layer using electric fields. An OLED displays images by forming an organic light emitting diode at each pixel disposed in a matrix.

As a self-emitting display device, an organic light emitting diode display device (OLED) has various advantages such as fast response speed, high brightness and wide view angle. Such an OLED, which uses an organic light emitting diode having good energy efficiencies, can be categorized into a passive matrix type organic light emitting diode display (or PMOLED) and an active matrix type organic light emitting diode display (or AMOLED).

As personal electronic devices are more prevalent, portable and/or wearable devices are actively developed. To apply a display device to portable and/or wearable devices, the display device is desired to have low power consumption. However, with the current display technology, it may be difficult to implement a portable/wearable device with low power consumption as desired.

SUMMARY

Accordingly, the present disclosure is directed to a thin film transistor substrate, a display including the same and a method of manufacturing the same that substantially obviate one or more problems due to limitations and disadvantages of the related art.

An advantage of the present disclosure is to provide a thin film transistor substrate for a flat panel display in which at least two transistors have different characteristics from each other.

Another advantage of the present disclosure is to provide a method of manufacturing a thin film transistor substrate having two different types of transistors for a flat panel display by a simplified manufacturing process.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display may, for example, include a substrate, a first thin film transistor, a second thin film transistor, a first storage capacitor electrode, an oxide layer, a nitride layer, a second storage capacitor electrode, a planar layer and a pixel electrode. The first thin film transistor is disposed in a first area on the substrate. The second thin film transistor is disposed in a second area on the substrate. The first storage capacitor electrode is disposed in a third area on the substrate. The oxide layer covers the first thin film transistor and the second thin film transistor, and exposes the first storage capacitor electrode. The nitride layer is disposed on the oxide layer and covers the first storage capacitor electrode. The second storage capacitor electrode includes a first metal layer and a second metal layer, and overlaps with the first storage capacitor electrode on the nitride layer. The planar layer covers the first thin film transistor, the second thin film transistor and the second storage capacitor electrode. The pixel electrode is disposed on the planar layer.

In one embodiment, the first thin film transistor includes: a first semiconductor layer; a first gate electrode overlapping with middle portions of the first semiconductor layer; a first source electrode contacting a first side of the first semiconductor layer; a first drain electrode contacting a second side of the first semiconductor layer; a first pixel contact hole exposing the first drain electrode by penetrating the nitride layer and the oxide layer; and an auxiliary drain electrode contacting the first drain electrode via the first pixel contact hole. The pixel electrode contacts the auxiliary drain electrode via a second pixel contact hole exposing the auxiliary drain electrode by penetrating the planar layer.

In one embodiment, the auxiliary drain electrode includes the second metal layer; and the first metal layer disposed under the second metal layer around the first pixel contact hole.

In one embodiment, the second thin film transistor is a switching element for selecting a pixel. Further, the first thin film transistor is a driving element for supplying video data to the pixel selected by the second thin film transistor.

In one embodiment, the oxide layer has thickness of 3,000 Å at least, and the nitride layer has thickness of 500 Å to 3,000 Å.

In one embodiment, the thin film transistor substrate further comprises: a first semiconductor layer including a polycrystalline semiconductor material; a gate insulating layer covering the first semiconductor layer; a first gate electrode overlapping with the first semiconductor layer on the gate insulating layer; a second gate electrode disposed on the gate insulating layer; an intermediate insulating layer covering the first gate electrode and the second gate electrode; a second semiconductor layer including an oxide semiconductor material and disposed with the second gate electrode on the intermediate insulating layer; a first source electrode and a first drain electrode disposed on the intermediate insulating layer; and a second source electrode and a second drain electrode disposed on the second semiconductor layer. The first thin film transistor includes the first semiconductor layer, the first gate electrode, the first source electrode and the first drain electrode. The second thin film transistor includes the second semiconductor layer, the second gate electrode, the second source electrode and the second drain electrode.

In one embodiment, the the intermediate insulating layer includes a nitride layer; and an oxide layer on the nitride layer.

The thin film transistor substrate and a flat panel display adopting the same substrate according to the present disclosure comprises two different type thin film transistors on the same substrate, so that the demerit of any one type thin film transistor can be compensated by the other type thin film transistor. Especially, including the thin film transistor having the low off-current characteristics, the display can be driven with the low frequency, it can have the low power consumption property and it can be applied to the portable and/or wearable appliances. Further, the thin film transistor substrate according to the present disclosure includes a passivation layer having the oxide material at the lower layer and the nitride material at the upper layer. With this structure of the passivation layer, the thin film transistor substrate can have storage capacitor ensuring the maximum capacitance with the minimum area, as well as the oxide semiconductor material can be protected from the hydrogen materials.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
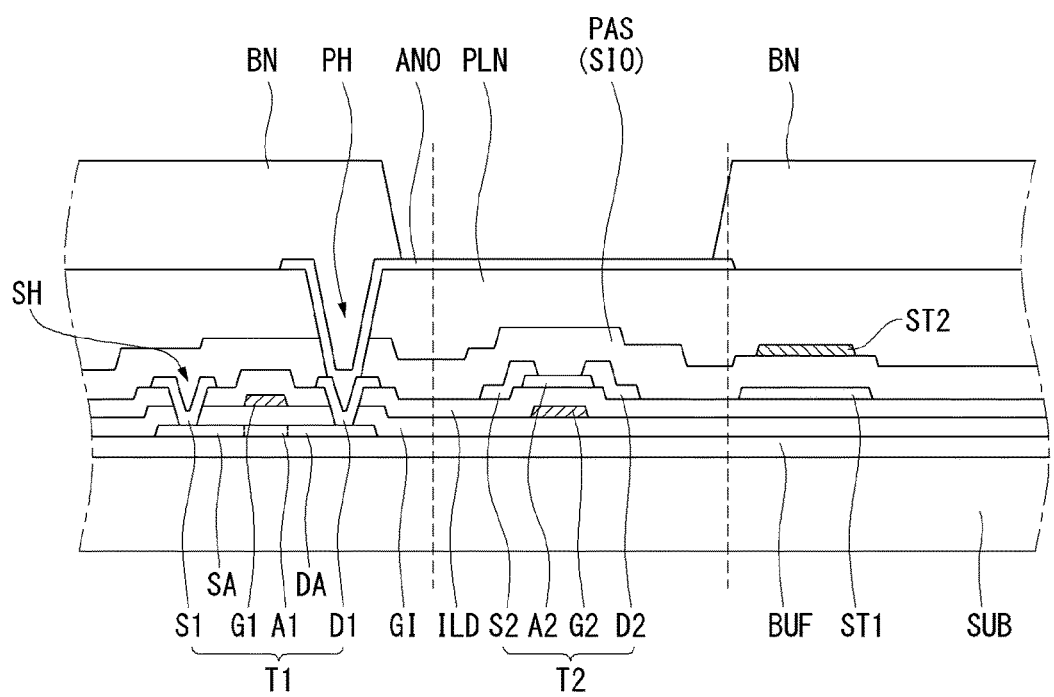
FIG. 1 is a cross sectional view illustrating a structure of a thin film transistor substrate for a flat panel display in which two different type thin film transistors are formed, according to the first embodiment of the present disclosure.

Hereinafter, the meaning for the term of "on" includes "directly on" and "indirectly on" in all scopes of the specifications. Of course, the meaning for the term of "under" includes "directly under" and "indirectly under" in all scopes of the specifications.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected for ease of explanation and may be different from actual names.

A thin film transistor substrate for a flat panel display according to an embodiment of the present disclosure comprises a first thin film transistor disposed in a first area and a second thin film transistor disposed in a second area, on the same substrate. The substrate may include a display area and a non-display area. In the display area, a plurality of pixels is arrayed in a matrix. In one pixel area, the display elements are disposed. In the non-display area surrounding the display area, the driver elements for driving the display elements in the pixel area are disposed.

Here, the first area may be the non-display area, and the second area may be some portions or all portions of the display area. In this case, the first thin film transistor and the second thin film transistor are disposed as they may be apart from each other. Otherwise, the first area and the second area may be included in the display area. Especially, for the case that a plurality of thin film transistors are disposed in one pixel area, the first thin film transistor and the second thin film transistor may be closely disposed.

As the polycrystalline semiconductor material has the characteristics of high mobility (over 100 $cm^2/Vs$) and of low energy consumption power, and it has high reliability, it is proper to apply to the driver IC, such as the gate driver for driving the display elements and/or the multiplexer (or 'MUX'). In addition, it can be applied to the driving thin film transistor disposed in the pixel area of the organic light emitting diode display. As the oxide semiconductor material has low off-current, it is proper to apply to the channel layer of the switching thin film transistor in the pixel area, in which the ON time period is very short but the OFF time period is long. Further, as the off-current is low, the holding time of the pixel voltage may be long, so that the oxide semiconductor material is suitable for a display device with low frequency drive and/or low power consumption. By disposing these two different type thin film transistors on the same substrate, it can be obtained a thin film transistor substrate representing the optimal effect.

When the semiconductor layer is formed using the polycrystalline semiconductor material, the doping process and high temperature treatment process are typically performed. On the contrary, when the semiconductor layer is formed using the oxide semiconductor material, the fabrication process can be performed at a relatively low temperature. Therefore, it is preferable that the polycrystalline semiconductor layer is formed first in severe conditions and then the oxide semiconductor layer is formed later. In addition, to simplify the manufacturing process, it is preferable that the first thin film transistor having the polycrystalline semiconductor material and the second thin film transistor having the oxide semiconductor material have the same structure. For example, the first gate electrode and the second gate electrode may be made of the same material on the same layer, and the first source-drain electrode and the second source-drain electrode may be made of the same material on the same layer. Especially, in order to ensure the characteristics of the semiconductor device, it is preferable that the thin film transistor have a top-gate structure that can accurately define the channel region.

Hereinafter, in short, the first thin film transistor is for the driver IC disposed in the non-display area and the second thin film transistor is for the display element disposed in the pixel area of the display area. However, it is not limited to this case only. For example, in the case of the organic light emitting diode display, the first thin film transistor and the second thin film transistor can be disposed at a pixel area in the display area. Especially, the first thin film transistor having the polycrystalline semiconductor material can be applied to the driving thin film transistor, and the second thin film transistor having the oxide semiconductor material can be applied to the switching thin film transistor.

In the case of forming a gate driver in the non-display area, the gate driver may be formed of C-MOS (complementary metal oxide semiconductor) type thin film transistor having the polycrystalline semiconductor material. For example, the P-MOS type thin film transistor and the N-MOS type thin film transistor including the polycrystalline semiconductor material may be formed for the gate driver within the non-display area. In this case, in order to form a low density doping area for the N-MOS thin film transistor, a number of mask processes may be required. Here, a mixed N-MOS type thin film transistor having the oxide semiconductor material may be used as the substitute for the N-MOS type thin film transistor having the polycrystalline semiconductor material. Then, this kind of N-MOS type thin film transistor having the oxide semiconductor material may not require a low density doping area, such that the number of mask processes can be reduced.

The thin film transistor substrate having two different type thin film transistors can be applied to a flat panel display device. For example, in the case of the organic light emitting diode display, the second thin film transistor may be applied to the switching thin film transistor for selecting a pixel and the first thin film transistor may be applied to the driving thin film transistor for supplying a video data voltage to the pixel. In some cases, it may be formed the other way around.

<First Embodiment>

Referring to FIG. 1, we will explain about the first embodiment of the present disclosure. FIG. 1 is a cross sectional view illustrating a structure of a thin film transistor substrate for a flat panel display in which two different type thin film transistors are formed, according to the first embodiment of the present disclosure. Here, we will explain with the cross sectional views mainly because it clearly shows the main features of the present disclosure, in convenience, the plan view is not used.

Referring to FIG. 1, the thin film transistor substrate for a flat panel display according to the first embodiment comprises a first thin film transistor T1 and a second thin film transistor T2 which are disposed on the same substrate SUB. The first and second thin film transistors T1 and T2 may be disposed apart from each other, or they may be disposed within a relatively close distance. Otherwise these two thin film transistors are disposed as being overlapped each other.

On the whole surface of the substrate SUB, a buffer layer BUF is deposited. In some cases, the buffer layer BUF may be omitted. Otherwise, the buffer layer BUF may be a laminated layer including a plurality of thin layers. Here, for example, we will explain with a single layer. Further, a light shield layer may be formed at some areas between the substrate SUB and the buffer layer BUF. The light shield layer may be formed to prevent the external light from entering the semiconductor layer of the thin film transistor disposed thereon.

On the buffer layer BUF, a first semiconductor layer A1 is disposed. The first semiconductor layer A1 includes a channel region of the first thin film transistor T1. The channel region is defined as an overlapped area between the first gate electrode G1 and the first channel layer A1. As the first gate electrode G1 is overlapped with a middle portion of the first semiconductor layer A1, the middle portion of the first semiconductor layer A1 is the channel region. Both side edges of the channel region where impurity ions are doped are defined as the source area SA and the drain area DA, respectively.

When the first thin film transistor T1 is a driving transistor, it is preferable that the semiconductor layer has appropriate characteristics to perform a high speed processing. For example, a P-MOS type or an N-MOS type thin film transistor may be used or a C-MOS type may be applied for the first thin film transistor T1. The P-MOS, N-MOS and/or C-MOS type thin film transistor preferably has the polycrystalline semiconductor material, such as poly-crystalline silicon (p-Si). Further, it is preferable that the first thin film transistor T1 preferably has the top gate structure.

On the whole surface of the substrate SUB having the first semiconductor layer A1, a gate insulating layer GI is deposited. The gate insulating layer GI may be made of silicon nitride (SiNx) material and/or silicon oxide (SiOx). It is preferable that the gate insulating layer GI has the thickness of 1,000 Å~2,000 Å for ensuring the stability and characteristics of the device. In the case that the gate insulating layer GI is made of silicon nitride (SiNx), in view of the manufacturing process, the gate insulating layer GI may comprise a large amount of hydrogen. As the hydrogen tends to diffuse into other layers from the gate insulating layer GI, it is preferable that the gate insulating layer GI is made of silicon oxide (SiOx).

The diffusion of the hydrogen from the gate insulating layer may cause positive effects on the first semiconductor layer A1 including polycrystalline semiconductor material. However, it may cause negative effects on the second thin film transistor T2 having different materials and/or characteristics from the first thin film transistor T1. Therefore, when at least two thin film transistors having different characteristics each other are formed on the same substrate SUB, it is preferable that the gate insulating layer GI be made of silicon oxide (SiOx) which does not have any specific effects on the device. There are some cases, unlike in the first embodiment, to form a thick gate insulating layer GI in the range of 2,000 Å~4,000 Å. In those cases, when the gate insulating layer GI is made of silicon nitride (SiNx), a degree of hydrogen diffusion can be severe. Considering these cases, it is preferable that the gate insulating layer GI be made of an oxide layer such as silicon oxide (SiOx).

On the gate insulating layer GI, a first gate electrode G1 and a second gate electrode G2 are disposed. The first gate electrode G1 is disposed over the middle portion of the first semiconductor layer A1. The second gate electrode G2 is located where the second thin film transistor T2 is disposed. Since the first and the second gate electrodes G1 and G2 are formed on the same layer, with the same material, and by using the same mask process, the manufacturing process can be simplified.

Then, an intermediate insulating layer ILD is deposited to cover the first and the second gate electrodes G1 and G2. The intermediate insulating layer ILD has a multiple laminated layer structure, in which a nitride layer including a silicon nitride (SiNx) and an oxide layer including a silicon oxide (SiOx) may be alternatively stacked.

The nitride layer is deposited to perform the hydrogenation of the first semiconductor layer A1 having the polycrystalline silicon through the subsequent heat treatment process by diffusing hydrogen contained therein into the polycrystalline silicon. On the contrary, the oxide layer is to prevent the hydrogen released by the nitride layer by the subsequent heat treatment step from being diffused too much into the semiconductor material of the second thin film transistor T2.

For example, the hydrogen released from the nitride layer may diffuse into the first semiconductor layer A1 under the gate insulating layer GI. Therefore, the nitride layer above the gate insulating layer GI is preferably deposited as close to the first semiconductor layer as possible. On the contrary, it is desirable that the hydrogen released from the nitride layer should not diffuse too much into the semiconductor material of the second thin film transistor T2 over the gate insulating layer GI. Therefore, it is preferable to stack the oxide layer on the nitride layer. Considering the manufacturing process, it is preferable that the intermediate insulating layer ILD has the thickness of 2,000 Å~6,000 Å. Therefore, it is preferable that each of the nitride layer and the oxide layer has a thickness of 1,000 Å~3,000 Å, respectively. Further, in order to ensure that much more amount of hydrogen released from the nitride layer is diffused into the first semiconductor layer A1, while the hydrogen gives less effect on the second semiconductor layer A2, it is preferable that the oxide layer is thicker than the gate insulating layer GI. In addition, as the oxide layer is for controlling the degree of diffusion of the hydrogen released from the nitride layer, it is preferable that the oxide layer is thicker than the nitride layer.

Especially, on the oxide layer of the intermediate insulating layer ILD, a second semiconductor layer A2 overlapping with the second gate electrode G2 is disposed. The second semiconductor layer A2 includes a channel area of the second thin film transistor T2. If the second thin film transistor T2 is applied for the display element, it is preferable that the second thin film transistor T2 has the characteristics suitable for performing display processing. For example, it is preferable that the second semiconductor layer A2 includes an oxide semiconductor material such as an indium gallium zinc oxide (or 'IGZO'), an indium gallium oxide (or 'IGO'), or an indium zinc oxide (or 'IZO'). The oxide semiconductor material is suitable for a display device with low-speed driving and low power consumption, thanks to its low Off-Current characteristic and long voltage holding period of the pixels. For the thin film transistor having the oxide semiconductor material, considering the structure in which two different type thin film transistors are formed on the same substrate, it is preferable that the oxide semiconductor thin film transistor has the bottom gate structure to ensure the stability of the elements.

On the second semiconductor layer A2 and the intermediate insulating layer ILD, the source-drain electrodes and the first storage capacitor electrode ST1 are disposed. The first source electrode S1 and the first drain electrode D1 are disposed as facing each other with a predetermined distance across the first gate electrode G1. The first source electrode S1 is connected to one side of the first semiconductor layer A1, which is a source area SA exposed through the source contact hole SH. The source contact hole SH exposes the one side of the first semiconductor layer A1, which is the source area SA, by penetrating the intermediate insulating layer ILD and the gate insulating layer GI. The first drain electrode D1 is connected to the other side of the first semiconductor layer A1, which is a drain area DA, exposed through a drain contact hole DH. The drain contact hole DH exposes the other side of the first semiconductor layer A1, which is the drain area DA, by penetrating the intermediate insulating layer ILD and the gate insulating layer GI.

The second source electrode S2 and the second drain electrode D2 are disposed as facing each other with a predetermined distance across the second gate electrode G2, and as contacting the upper surfaces of one side and the other side of the second semiconductor layer A2. The second source electrode S2 directly contacts the upper surface of the intermediate insulating layer ILD and one upper surface of the second semiconductor layer A2. The second drain electrode D2 directly contacts the upper surface of the intermediate insulating layer ILD and the other upper surface of the second semiconductor layer A2.

It is preferable that the first storage capacitor electrode ST1 is disposed in the non-display area not overlapping with the first and the second thin film transistors T1 and T2. The first storage capacitor electrode ST1 may form the storage capacitance as overlapping with the second storage capacitor electrode ST2. The storage capacitance is for enhancing the driving speed and efficiencies at next driving time, by holding voltage and/or carriers (electrons or holes) supplied from the driving thin film transistor in advance.

On the whole surface of the substrate SUB having the first thin film transistor T1, the second thin film transistor T2 and the first storage capacitor electrode ST1, a passivation layer PAS is deposited. The passivation layer PAS is directly contacting the second semiconductor layer A2 of the second thin film transistor T2. Therefore, it is preferable that the passivation layer PAS includes a material giving no bad effect to the second semiconductor layer A2 having the oxide semiconductor material. For example, it is preferable that the passivation layer PAS is made of the oxide layer SIO to avoid the nitride layer containing a large amount of hydrogen materials.

On the passivation layer PAS including the oxide layer SIO such as the silicon oxide (SiOx), the second storage capacitor electrode ST2 is formed. It is preferable that the second storage capacitor electrode ST2 has the same shape and the same size with those of the first storage capacitor electrode ST1. As the second storage capacitor electrode ST2 is facing to the first storage capacitor electrode ST1 with the passivation layer PAS there-between, the storage capacitance is formed between the first and the second storage capacitor electrodes ST1 and ST2.

In the case of the organic light emitting diode display, after forming the first thin film transistor T1 and the second thin film transistor T2, the organic light emitting diode may be formed. The organic light emitting diode includes an organic light emitting layer. It is preferable that the organic light emitting layer is deposited on a planar surface. Therefore, the planar layer PLN may be further deposited over the second storage capacitor electrode ST2 formed on the passivation layer PAS.

On the planar layer PLN, a pixel electrode may be formed. The pixel electrode may contact the first drain electrode D1 or the second drain electrode D2 through the pixel contact hole PH penetrating the planar layer PLN and the passivation layer PAS. Here, as explaining the organic light emitting diode display, the pixel electrode is for the anode electrode ANO and the first thin film transistor T1 is for the driving thin film transistor. Therefore, the anode electrode ANO is contacting the first drain electrode D1 via the pixel contact hole PH.

On the whole surface of the substrate SUB having the anode electrode ANO, a bank BN is formed. The bank BN defines an emitting area by exposing some portions of the anode electrode ANO and covering the others areas. By depositing an organic light emitting layer on the substrate SUB having the bank BN, the organic light emitting layer can be stacked on and directly contacting the exposed portions of the anode electrode ANO within the emitting area. After that, by depositing a cathode electrode on the organic light emitting layer, the organic light emitting diode is completed as the anode electrode ANO, the organic light emitting layer, and the cathode electrode are stacked within the emitting area.

Figure 2:
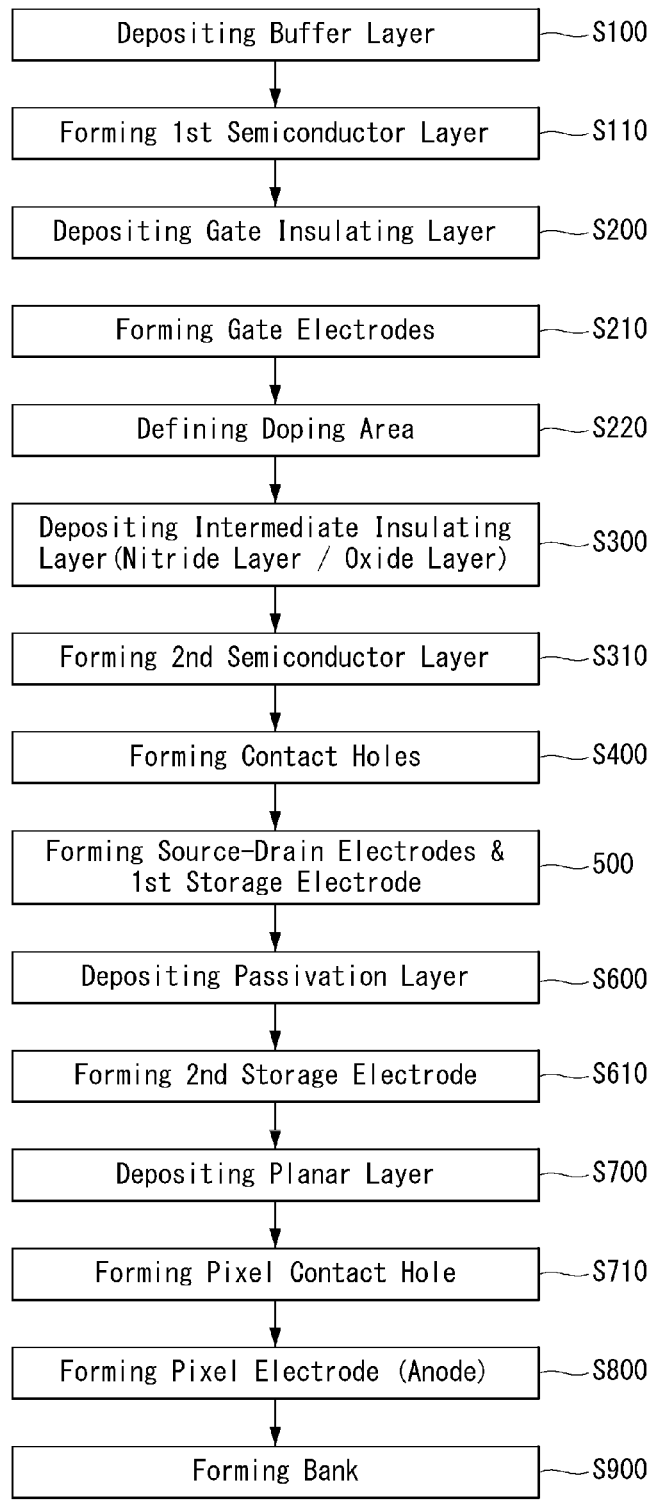
FIG. 2 is a flow chart illustrating a method for manufacturing the thin film transistor substrate for a flat panel display in which two different type thin film transistors are formed, according to the first embodiment of the present disclosure.

Hereinafter, referring to FIG. 2, we will explain about the manufacturing method for the thin film transistor substrate of the flat panel display including two different thin film transistors on the same substrate. FIG. 2 is a flow chart illustrating a method for manufacturing the thin film transistor substrate having two different type thin film transistors according to the first embodiment of the present disclosure.

In the step of S100, on a substrate SUB, a buffer layer BUF is deposited. Even though it is not shown in the figures, before depositing the buffer layer BUF, a light-shielding layer may be formed at desired area.

In the step of S110, on the buffer layer BUF, an amorphous silicon (a-Si) material is deposited. By performing a crystallization process, the amorphous silicon layer is converted into a polycrystalline silicon (poly-Si). Using a first mask process, the polycrystalline silicon layer is patterned to form a first semiconductor layer A1.

In the step of S200, by depositing an insulating material such as silicon oxide on the whole surface of the substrate SUB having the first semiconductor layer A1, a gate insulating layer GI is formed. The gate insulating layer GI is preferably formed of a silicon oxide. Here, the thickness of the gate insulating layer GI is preferably from 1000 Å to 2000 Å.

In the step of S210, on the gate insulating layer GI, a gate metal material is deposited. Using a second mask process, the gate metal layer is patterned to form the gate electrodes. Especially, a first gate electrode G1 for the first thin film transistor T1 and a second gate electrode G2 for the second thin film transistor T2 are formed at the same time. The first gate electrode G1 is disposed as overlapping with the middle portion of the first semiconductor layer A1. The second gate electrode G2 is disposed where the second thin film transistor T2 is formed.

In the step of S220, using the first gate electrode G1 as a mask, impurity materials are doped into some portions of the first semiconductor layer A1 so that doping areas including a source area SA and a drain area DA may be defined. The detailed manufacturing process for the doping areas may differ slightly according to the types of thin film transistor, P-MOS type, N-MOS type and/or C-MOS type. For example, in the case of the N-MOS type thin film transistor, a heavily doped region may be formed first, and then a lightly doped region may be formed later. Using the photo-resist pattern for the first gate electrode G1 which has a larger size than the first gate electrode G1, the heavily doped region can be defined. By removing the photo-resist pattern and using the first gate electrode G1 as a mask, the lightly doped region (or, 'LDD') can be defined between the heavily doped region and the first gate electrode G1. The impurity doping areas are not shown in the figures, for convenience.

In the step of S300, on the whole surface of the substrate SUB having the first gate electrode G1 and the second gate electrode G2, an intermediate insulating layer ILD is deposited. In the case that the intermediate insulating layer ILD has the stacked structure of nitride layer and the oxide layer, it is preferable that the nitride layer is deposited first and then the oxide layer is stacked thereon. Considering the manufacturing process, the total thickness of the intermediate insulating layer ILD may have a thickness of 2,000 Å~6,000 Å.

In the step of S310, on the intermediate insulating layer ILD, an oxide semiconductor material is deposited. In the case that the intermediate insulating layer ILD has a nitride layer and an oxide layer, the oxide semiconductor material is preferably deposited directly on the oxide layer such that the oxide semiconductor material is not directly in contact with the nitride layer containing a large amount of hydrogen. The oxide semiconductor material includes at least one of Indium Gallium Zinc Oxide (or 'IGZO'), Indium Gallium Oxide (or 'IGO'), and Indium Zinc Oxide (or 'IZO'). Using a third mask process, the oxide semiconductor material is patterned to form a second semiconductor layer A2. The second semiconductor layer A2 is disposed so as to overlap the second gate electrode G2.

In the step of S400, using a fourth mask process, the intermediate insulating layer ILD and the gate insulating layer GI are patterned to form a source contact hole SH exposing one portion of the first semiconductor layer A1 and a drain contact hole DH exposing the other portion of the first semiconductor layer A1. These contact holes SH and DH are for connecting the source-drain electrode to the first semiconductor layer A1, later.

In the step of S500, a source-drain metal material is deposited on the intermediate layer ILD having the source contact hole SH and the drain contact hole DH and the second semiconductor layer A2. Using a fifth mask process, the source-drain metal material is patterned to form a first source electrode S1, a first drain electrode D1, a second source electrode S2, a second drain electrode D2 and a first storage capacitor electrode ST1. The first source electrode S1 contacts one area of the first semiconductor layer A1, which is the source area SA, through the source contact hole SH. The first drain electrode D1 contacts the other area of the first semiconductor layer A1, which is the drain area DA, through the drain contact hole DH. The second source electrode S2 contacts the upper surface of one side of the second semiconductor layer A2. The second drain electrode D2 contacts the upper surface of the other side of the second semiconductor layer A2. The first storage capacitor electrode ST1 is placed in a position to form a storage capacitor. The first storage capacitor electrode ST1 may be electrically connected to the first drain electrode D1 or the second drain electrode D2.

In the step of S600, on the whole surface of the substrate SUB having the source-drain electrodes, a passivation layer PAS is deposited. As the passivation layer PAS is directly contacting the second semiconductor layer A2, it is preferable that the passivation layer PAS includes an oxide layer SIO such as silicon oxide (SiOx). It is preferable that the passivation layer PAS is not made of nitride material because a nitride layer such as silicon nitride (SiNx) may cause defects on the second semiconductor layer A2. In the case that the passivation layer PAS includes only an oxide layer SIO, it is preferable that the oxide layer SIO has a thickness over 3,000 Å.

In the step of S610, a metal material is deposited on the passivation layer PAS. Using a sixth mask process, the metal material is patterned to form a second storage capacitor electrode ST2. The second storage capacitor electrode ST2 may be formed as having the same size with the first storage capacitor electrode ST1 and overlapping with the first storage capacitor electrode ST1. A storage capacitance is formed at the sandwiched portions of the passivation layer PAS that the first storage capacitor electrode ST1 and the second storage capacitor electrode ST2 are overlapped.

In the step of S700, on the passivation layer PAS having the second storage capacitor electrode ST2, a planar layer PLN is deposited. For making flat the upper surface of the substrate SUB, the planar layer PLN may include an organic insulating material. It is preferable that the thickness of the planar layer PLN is over 5,000 Å.

In the step of S710, using a seventh mask process, the planar layer PLN and the passivation layer PAS are patterned at the same time to form a pixel contact hole PH exposing the first drain electrode D1. Here, the first thin film transistor T1 is a driving thin film transistor for driving the pixel, the pixel contact hole PH exposes the first drain electrode D1. For another example, if the second thin film transistor T2 is a driving thin film transistor for driving the pixel, the pixel contact hole PH may expose the second drain electrode D2.

In the step of S800, on the whole surface of the substrate SUB having the pixel contact hole PH, a conductive layer is deposited. The conductive material includes a metal material or a transparent conductive material. Using an eighth mask process, the conductive layer is patterned to form a pixel electrode. Here, the pixel electrode corresponds to the anode electrode ANO for the organic light emitting diode display.

In the step of S900, for the organic light emitting diode display, an organic insulating material is deposited on the substrate SUB having the anode electrode ANO. Using ninth mask process, the organic insulating material is patterned to form a bank BN. The bank BN is patterned to expose the emitting area of the anode electrode ANO.

<Second Embodiment>

Figure 3:
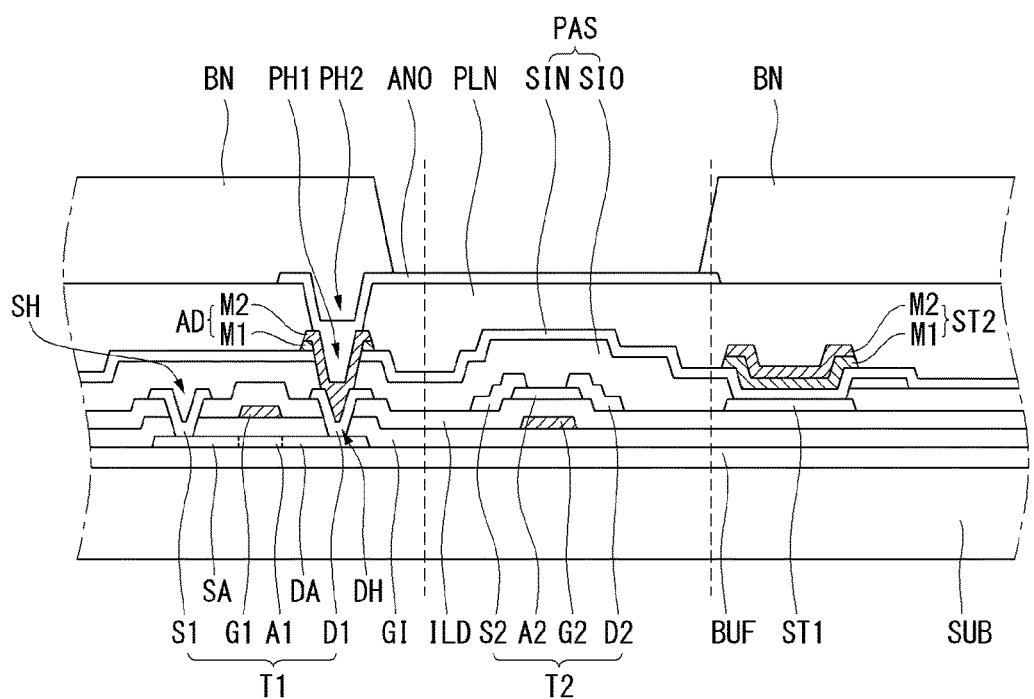
FIG. 3 is a cross sectional view illustrating a structure of a thin film transistor substrate for a flat panel display in which two different type thin film transistors are formed, according to the second embodiment of the present disclosure.

Hereinafter, referring to FIG. 3, we will explain about the second embodiment of the present disclosure. FIG. 3 is a cross sectional view illustrating a structure of a thin film transistor substrate for a flat panel display in which two different type thin film transistors are formed, according to the second embodiment of the present disclosure.

In the first embodiment, for forming the storage capacitance, the first storage capacitor electrode ST1 and the second storage capacitor electrode ST2 are overlapped with a passivation layer PAS including the oxide layer SIO there-between. In order to ensure the surface property and uniformity, the oxide layer SIO should have a thickness of at least 3000 Å. Therefore, the storage capacitance is formed at the oxide layer SIO having the thickness of at least 3,000 Å interposed between the first storage capacitor electrode ST1 and the second storage capacitor electrode ST2.

The oxide layer SIO has a lower dielectric constant (or permittivity) than nitride layer. Therefore, the size of the overlapped area between the first storage capacitor electrode ST1 and the second storage capacitor electrode ST2 should be large enough to ensure wanted amount of storage capacitance. Nowadays, the flat panel display has a higher resolution and density so that the pixel size is becoming smaller. Under these conditions, the size of the storage capacitor electrode is the main obstacle for reducing the size of the pixel. To secure a sufficient storage capacitance of at least 100 fF, and to reduce the size of the storage capacitor electrode, the thickness of the insulating layer disposed between the first storage capacitor electrode ST1 and the second storage capacitor electrode ST2 should be made thin.

As the oxide layer SIO should have a sufficient thickness enough to ensure the surface property and the oxide layer SIO has lower dielectric constant, it is very hard to keep the enough amount of the storage capacitance with smaller size. The nitride layer has the merit that it has higher dielectric constant than oxide layer and it has better surface property with thinner thickness than the oxide layer. However, as the passivation layer PAS is directly contacting the second semiconductor layer A2 including the oxide semiconductor material, the nitride layer is not applied to the passivation layer PAS. In the second embodiment of the present disclosure, we suggest a structure of the thin film transistor substrate in which demerits of the oxide layer and the nitride layer are complemented and the merits of them are optimized by stacking them.

Referring to FIG. 3, the thin film transistor substrate for a flat panel display according to the second embodiment comprises a first thin film transistor T1 and a second thin film transistor T2 which are disposed on the same substrate SUB. The first and second thin film transistors T1 and T2 may be disposed apart from each other, or they may be disposed within a relatively close distance. Otherwise these two thin film transistors are disposed as being overlapped each other.

On the whole surface of the substrate SUB, a buffer layer BUF is deposited. The buffer layer BUF may be formed as mentioned in the first embodiment.

On the buffer layer BUF, a first semiconductor layer A1 is disposed. The first semiconductor layer A1 includes a channel area of the first thin film transistor T1. The channel area is defined as the overlapped area between the first gate electrode G1 and the first semiconductor layer A1. As the first gate electrode G1 is overlapped with middle portion of the first semiconductor layer A1, the middle portion of the first semiconductor layer A1 is the channel area. Both side edges of the channel area where the impurities are doped are defined as the source area SA and the drain area DA, respectively.

For the case that the first thin film transistor T1 is for a driver transistor, it is preferable that the semiconductor layer has characteristics for high-speed driving processing with a lower power consumption. Further, the first thin film transistor T1 preferably has a top gate structure.

On the whole surface of the substrate SUB having the first semiconductor layer A1, a gate insulating layer GI is deposited. The gate insulating layer GI may be made of silicon nitride (SiNx) material or silicon oxide (SiOx) material. It is preferable that the gate insulating layer GI has a thickness of 1,000 Å~2,000 Å to ensure the stability and characteristics of the device. In the case that the gate insulating layer GI may be made of silicon nitride (SiNx), in the view point of manufacturing process, the gate insulating layer GI includes a large amount of hydrogen. As the hydrogen would be diffused out from the gate insulating layer GI, it is preferably that the gate insulating layer GI is made of silicon oxide material.

On the gate insulating layer GI, a first gate electrode G1 and the second gate electrode G2 are disposed. The first gate electrode G1 is disposed over the middle portion of the first semiconductor layer A1. The second gate electrode G2 is located where the second thin film transistor T2 is disposed. The first and the second gate electrodes G1 and G2 are formed on the same layer, with the same material, and by using the same mask process. Therefore, the manufacturing process can be simplified.

As covering the first and the second gate electrodes G1 and G2, an intermediate insulating layer ILD is deposited. The intermediate insulating layer ILD has a multiple laminated layer structure, in which a nitride layer including a silicon nitride (SiNx) and an oxide layer including a silicon oxide (SiOx) may be alternatively stacked.

Especially, on the oxide layer of the intermediate insulating layer ILD, a second semiconductor layer A2 overlapping with the second gate electrode G2 is disposed. The second semiconductor layer A2 includes a channel area of the second thin film transistor T2. In the case that the second thin film transistor T2 is applied for a display element, it is preferable that the second semiconductor layer A2 has characteristics proper to perform the switching element. For example, it is preferable that the second semiconductor layer A2 includes an oxide semiconductor material such as an indium gallium zinc oxide (or 'IGZO'), an indium gallium oxide (or 'IGO'), or an indium zinc oxide (or 'IZO').

The oxide semiconductor material has a merit for driving the device with relatively low frequency. Thanks to these characteristics, the pixels may have a long period for holding the pixel voltage, so that it is preferable to apply it to a display with low frequency drive and/or low power consumption. For the thin film transistor having the oxide semiconductor material, considering the structure in which two different type thin film transistors are formed on the same substrate, it is preferable that the oxide semiconductor thin film transistor has a bottom gate structure for ensuring the stability of the device.

On the second semiconductor layer A2 and the intermediate insulating layer ILD, the source-drain electrodes and the first storage capacitor electrode ST1 are disposed. The first source electrode S1 and the first drain electrode D1 are disposed as facing each other with a predetermined distance across the first gate electrode G1. The first source electrode S1 is connected to one side of the first semiconductor layer A1, which is a source area SA, through a source contact hole SH. The source contact hole SH exposes the one side of the first semiconductor layer A1, which is the source area SA, by penetrating the intermediate insulating layer ILD and the gate insulating layer GI. The first drain electrode D1 is connected to the other side of the first semiconductor layer A1, which is a drain area DA, through a drain contact hole DH. The drain contact hole DH exposes the other side of the first semiconductor layer A1, which is the drain area DA, by penetrating the intermediate insulating layer ILD and the gate insulating layer GI.

The second source electrode S2 and the second drain electrode D2 are disposed as facing each other with a predetermined distance across the second gate electrode G2, and as contacting the upper surfaces of one side and the other side of the second semiconductor layer A2. The second source electrode S2 directly contacts the upper surface of the intermediate insulating layer ILD and one upper surface of the second semiconductor layer A2. The second drain electrode D2 directly contacts the upper surface of the intermediate insulating layer ILD and the other upper surface of the second semiconductor layer A2.

It is preferable that the first storage capacitor electrode ST1 is disposed in the non-display area not overlapping with the first and the second thin film transistors T1 and T2. The first storage capacitor electrode ST1 may form a storage capacitance as overlapping with the second storage capacitor electrode ST2. The storage capacitance is for enhancing the driving speed and efficiencies at next driving time, by holding voltage and/or carriers (electrons or holes) supplied from the driving thin film transistor in advance.

On the whole surface of the substrate SUB having the first thin film transistor T1, the second thin film transistor T2 and the first storage capacitor electrode ST1, a passivation layer PAS is deposited. The passivation layer PAS is directly contacting the second semiconductor layer A2 of the second thin film transistor T2. Therefore, it is preferable that the passivation layer PAS includes a material giving no bad effect to the second semiconductor layer A2 having the oxide semiconductor material. For example, avoiding the nitride material having a large amount of hydrogen materials, the passivation layer PAS may be made of an oxide layer SIO.

Considering the surface stability and property, it is preferable that the oxide layer SIO has a thickness of at least 3,000 Å. As the oxide layer SIO has a lower dielectric constant than the nitride layer and it would be deposited thicker thickness than the nitride layer, it is hard to ensure enough storage capacitance. Therefore, in the second embodiment, the oxide layer is not used for forming the storage capacitance. By patterning the oxide layer SIO, all surface of the first storage capacitor electrode ST1 are exposed. At this time, a first pixel contact hole PH1 for exposing the first drain electrode D1 is also formed.

On the substrate SUB exposing the first storage capacitor electrode ST1, a nitride layer SIN including an inorganic insulating material such as silicon nitride (SiNx) is deposited. The nitride layer SIN is for forming the storage capacitance. Even though the nitride layer SIN has a thickness of 3,000 Å, it is possible to ensure enough amount of storage capacitance because the nitride layer has a higher dielectric constant than the oxide layer. To ensure much higher amount of the storage capacitance, it is preferable that the nitride layer has a thickness less than 3,000 Å. With higher dielectric constant and better surface stability and property than the oxide layer, the nitride layer can hold higher amount of the storage capacitance with less size than the oxide layer.

On the nitride layer SIN, a second storage capacitor electrode ST2 is formed. It is preferable that the second storage capacitor electrode ST2 has the same shape and the same size with those of the first storage capacitor electrode ST1. As the second storage capacitor electrode ST2 is facing to the first storage capacitor electrode ST1 with the nitride layer SIN there-between, the storage capacitance is formed between the first and the second storage capacitor electrodes ST1 and ST2.

The auxiliary drain electrode AD contacting the first drain electrode D1 is formed. The auxiliary drain electrode AD has the same material with the second storage capacitor electrode ST2. Especially, considering the manufacturing processes, the second storage capacitor electrode ST2 and the auxiliary drain electrode AD have the structure in which the first metal layer M1 and the second metal layer M2 are stacked.

On the whole surface of the substrate SUB having the second storage capacitance ST2 and the auxiliary drain electrode AD, a planar layer PLN is deposited. As mentioned in the first embodiment, the planar layer PLN is for making flat the top surface of the substrate SUB having the thin film transistors and the storage capacitance.

On the planar layer PLN, a pixel electrode may be formed. The pixel electrode may contact the first drain electrode D1 or the second drain electrode D2 through the second pixel contact hole PH2 penetrating the planar layer PLN. Here, as explaining the organic light emitting diode display, the pixel electrode is for the anode electrode ANO and the first thin film transistor T1 is for the driving thin film transistor. Therefore, the anode electrode ANO is contacting the first drain electrode D1 via the second pixel contact hole PH2.

On the whole surface of the substrate SUB having the anode electrode ANO, a bank BN is formed. The bank BN defines an emitting area by exposing some portions of the anode electrode ANO and covering the others areas. By depositing the organic light emitting layer on the substrate SUB having the bank BN, the organic light emitting layer is stacked on and directly contacting the exposed portions of the anode electrode ANO within the emitting area. After that, by depositing a cathode electrode on the organic light emitting layer, the organic light emitting diode is completed as the anode electrode ANO, the organic light emitting layer, and the cathode electrode are stacked within the emitting area.

Figure 4:
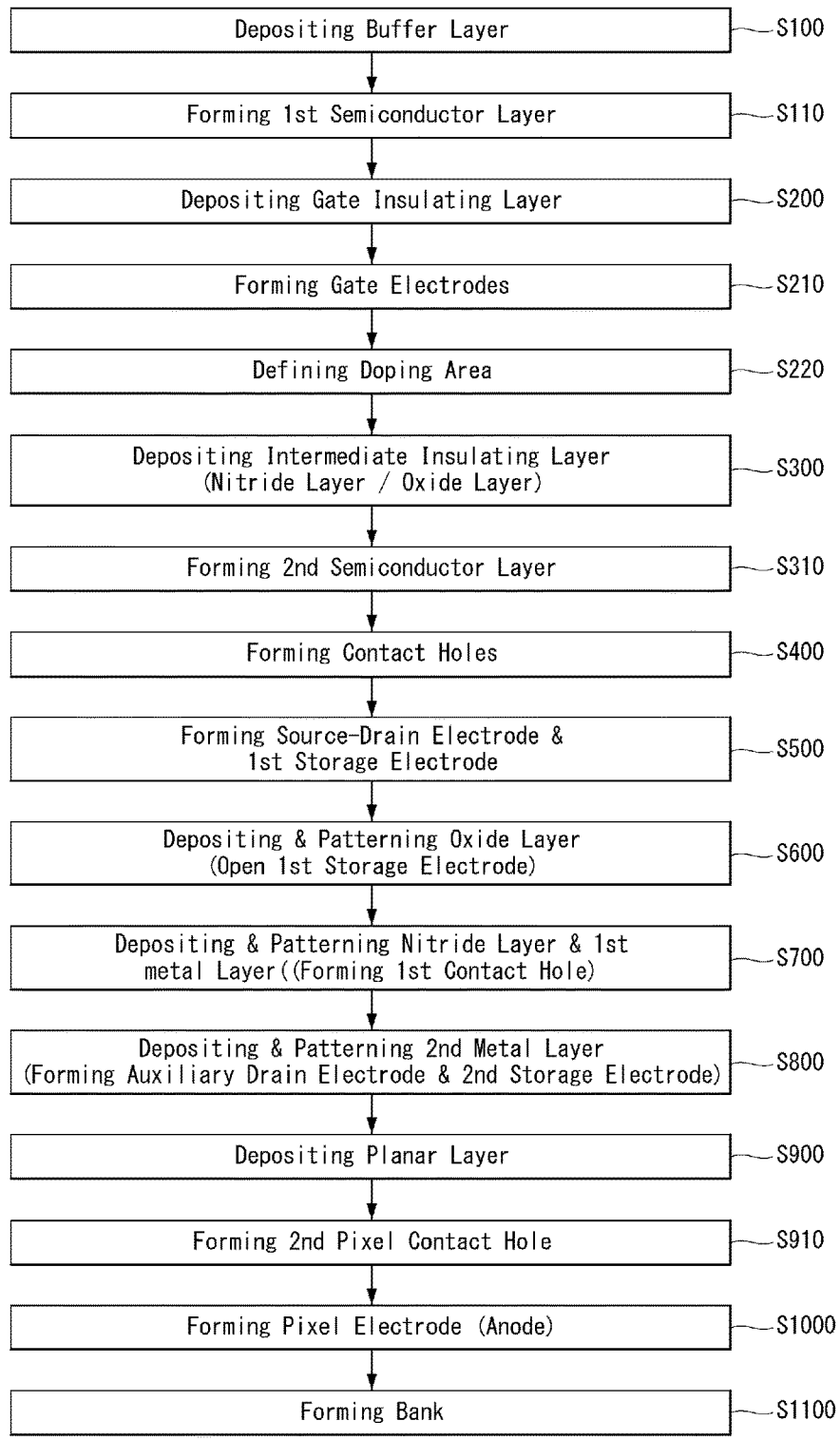
FIG. 4 is a flow chart illustrating a method for manufacturing the thin film transistor substrate for a flat panel display in which two different type thin film transistors are formed, according to the second embodiment of the present disclosure.

Hereinafter, referring to FIG. 4, we will explain about the method for manufacturing the thin film transistor substrate for flat panel display according to the second embodiment of the present disclosure. FIG. 4 is a flow chart illustrating a method for manufacturing the thin film transistor substrate for a flat panel display in which two different type thin film transistors are formed, according to the second embodiment of the present disclosure.

In the step of S100, on a substrate SUB, a buffer layer BUF is deposited. Even though it is not shown in figures, before depositing the buffer layer BUF, a light shield layer may be formed at desired area.

In the step of S110, on the buffer layer BUF, an amorphous silicon (a-Si) material is deposited. By performing the crystallization process, the amorphous silicon layer is converted into the polycrystalline silicon (poly-Si). Using a first mask process, the polycrystalline silicon layer is patterned to form a first semiconductor layer A1.

In the step of S200, depositing an insulating material such as an silicon oxide on the whole surface of the substrate SUB having the first semiconductor layer A1, a gate insulating layer GI is formed. The gate insulating layer GI preferably includes a silicon oxide. Here, the gate insulating layer GI preferably has a thickness of 1,000 Å or more and 2,000 Å or less.

In the step of S210, on the gate insulating layer GI, a gate metal material is deposited. Using a second mask process, the gate metal layer is patterned to form the gate electrodes. Especially, a first gate electrode G1 for the first thin film transistor T1 and a second gate electrode G2 for the second thin film transistor T2 are formed at the same time. The first gate electrode G1 is disposed as overlapping with a middle portion of the first semiconductor layer A1. The second gate electrode G2 is disposed where the second thin film transistor T2 is formed.

In the step of S220, using the first gate electrode G1 as a mask, impurity materials are doped into some portions of the first semiconductor layer A1 so that doping areas including a source area SA and a drain area DA may be defined. The detail manufacturing process for the doping areas may be slightly different according to the types of thin film transistor, P-MOS type, N-MOS type and/or C-MOS type.

In the step of S300, on the whole surface of the substrate SUB having the first gate electrode G1 and the second gate electrode G2, an intermediate insulating layer ILD is deposited. In the case that the intermediate insulating layer ILD has a stacked structure of nitride layer and oxide layer, it is preferable that the nitride layer is deposited first and then the oxide layer is stacked thereon. Considering the manufacturing process, the total thickness of the intermediate insulating layer ILD may have a thickness of 2,000 Å~6,000 Å.

In the step of S310, on the intermediate insulating layer ILD, an oxide semiconductor material is deposited. For the case that the intermediate insulating layer ILD has the nitride layer and the oxide layer, the oxide semiconductor material is preferably deposited directly on the oxide layer in order that the oxide semiconductor material does not directly contact the nitride layer containing a large amount of hydrogen. Using a third mask process, the oxide semiconductor material is patterned to form a second semiconductor layer A2. The second semiconductor layer A2 is disposed as overlapping with the second gate electrode G2.

In the step of S400, using a fourth mask process, the intermediate insulating layer ILD and the gate insulating layer GI are patterned to form a source contact hole SH exposing one portion of the first semiconductor layer A1 and a drain contact hole DH exposing the other portion of the first semiconductor layer A1. These contact holes SH and DH are for connecting the source-drain electrode to the first semiconductor layer A1, later.

In the step of S500, a source-drain metal material is deposited on the intermediate layer ILD having the source contact hole SH and the drain contact hole DH and the second semiconductor layer A2. Using a fifth mask process, the source-drain metal material is patterned to form a first source electrode S1, a first drain electrode D1, a second source electrode S2, a second drain electrode D2 and a first storage capacitor electrode ST1. The first source electrode S1 contacts the one area of the first semiconductor layer A1, which is the source area SA, through the source contact hole SH. The first drain electrode D1 contacts the other area of the first semiconductor layer A1, which is the drain area DA, through the drain contact hole DH. The second source electrode S2 contacts the upper surface of the one side of the second semiconductor layer A2. The second drain electrode D2 contacts the upper surface of the other side of the second semiconductor layer A2. The first storage capacitor electrode ST1 is disposed where the storage capacitance is located. The first storage capacitor electrode ST1 may be electrically connected to the first drain electrode D1 or the second drain electrode D2.

In the step of S600, on the whole surface of the substrate SUB having the source-drain electrodes and the first storage capacitance electrode ST1, an oxide layer SIO is deposited. The oxide layer SIO is directly contacting the second semiconductor layer A2, so that it does not cause any defects on the oxide semiconductor material of the second semiconductor layer A2. It is preferable that the oxide layer SIO has the thickness over 3,000 Å. Using a sixth mask process, the oxide layer SIO is patterned to expose most of all surface of the first storage electrode ST1.

In the step of S700, a nitride layer SIN is deposited on the oxide layer SIO. The nitride layer SIN has a higher dielectric constant than the oxide layer SIO and has better surface stability and property than the oxide layer even though it has a thinner thickness than 3,000 Å. Therefore, the nitride layer SIN is used for forming the storage capacitance. It is preferable that the nitride layer SIN has a thickness of 500 Å~3,000 Å. A first metal layer M1 is sequentially deposited on the nitride layer SIN. Using a seventh mask process, the nitride layer SIN and the first metal layer M1 are patterned in one process to form a first pixel contact hole PH1 exposing the first drain electrode D1. On the surface of the substrate excepting the first pixel contact hole PH1, the first metal layer M1 is covering the substrate.

In the step of S800, on the whole surface of the substrate SUB having the first pixel contact hole PH1, a second metal layer M2 is deposited. Using a eighth mask process, the second metal layer M2 and the first metal layer M1 are patterned in one process to form a second storage capacitor electrode ST2. At the same time, an auxiliary drain electrode AD is formed as contacting the first drain electrode D1 via the first pixel contact hole PH1. The auxiliary drain electrode AD has the structure in which the first metal layer M1 and the second metal layer M2 are stacked. Further, only the second metal layer M2 is contacting the first drain electrode D1. The first metal layer M1 is disposed under the second metal layer M2 around the first contact hole PH1.

In the step of S900, on the passivation layer PAS having the auxiliary drain electrode AD and the second storage capacitor electrode ST2, a planar layer PLN is deposited.

For making flat the top surface of the substrate SUB, the planar layer PLN may include an organic insulating material. It is preferable that the thickness of the planar layer PLN is over 5,000 Å.

In the step of S910, using a ninth mask process, the planar layer PLN is patterned to form a second pixel contact hole PH2 exposing the auxiliary drain electrode AD. Here, the auxiliary drain electrode AD is explained as contacting the first drain electrode D1 of the first thin film transistor T1. However, in other case, the auxiliary drain electrode AD may contact the second drain electrode D2 of the second thin film transistor T2.

In the step of S1000, on the whole surface of the substrate SUB having the second pixel contact hole PH2, a conductive layer is deposited. The conductive material includes a metal material or a transparent conductive material. By patterning the conductive layer using a tenth mask process, a pixel electrode is formed. Here, the pixel electrode is the anode electrode ANO for the organic light emitting diode display.

In the step of S1100, for the organic light emitting diode display, on the substrate SUB having the anode electrode ANO, depositing an organic insulating material. Using an eleventh mask process, the organic insulating material is patterned to form a bank BN. The bank BN is patterned as exposing the emitting area of the anode electrode.

In the second embodiment, the passivation layer PAS has a stacked structure in which the nitride layer SIN is deposited on the oxide layer SIO. As the second thin film transistor T2 having the oxide semiconductor material is formed later, the second semiconductor layer A2 is directly contacting the passivation layer PAS. To protect the second semiconductor layer A2 having the oxide semiconductor material, the oxide layer SIO is disposed at the lower layer in the passivation layer PAS.

Further, as the oxide layer SIO may not be proper to form the storage capacitance having higher amount with smaller size, the nitride layer SIN is stacked at the upper layer in the passivation layer PAS. As the first storage capacitor electrode ST1 is made of the same material and at the same layer with the source-drain electrode, it is covered by the oxide layer SIO. Therefore, by patterning the oxide layer SIO, the first storage capacitor electrode ST1 is exposed and then the nitride layer SIN is deposited as covering the first storage capacitor electrode ST1.

By forming the second storage capacitor electrode ST2 on the nitride layer SIN, the storage capacitance can be secured. As the result, an embodiment of the present disclosure provides a thin film transistor substrate having two different type of thin film transistors on the same substrate in which the second semiconductor layer A2 including the oxide semiconductor material can be protected by the oxide layer, as well as the storage capacitance having a higher amount with smaller size can be formed.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A display comprising:
    a first thin film transistor on a substrate, the first thin film transistor including a first semiconductor layer, a first gate electrode, a first source electrode and a first drain electrode;
    a second thin film transistor on the substrate, the second thin film transistor including a second semiconductor layer, a second gate electrode, a second source electrode and a second drain electrode;
    a first storage capacitor electrode at same layer with the first drain electrode on the substrate;
    an oxide layer covering the first thin film transistor and the second thin film transistor, and exposing the first storage capacitor electrode;
    a nitride layer disposed on the oxide layer and covering the first storage capacitor electrode;
    a second storage capacitor electrode including a first metal layer and a second metal layer stacked on the first metal layer with same shape as the first metal layer, and overlapping with the first storage capacitor electrode on the nitride layer;
    a planar layer covering the first thin film transistor, the second thin film transistor and the second storage capacitor electrode: and
    a pixel electrode disposed on the planar layer,
    wherein the first gate electrode overlaps with middle portions of the first semiconductor layer;
    the first source electrode contacts a first side of the first semiconductor layer;
    the first drain electrode contacts a second side of the first semiconductor layer;
    the first drain electrode is exposed by a first pixel contact hole penetrating the nitride layer and the oxide layer; and
    the first drain electrode contacts an auxiliary drain electrode disposed at same layer with the second metal layer of the second storage capacitor electrode via the first pixel contact hole; and
    wherein the pixel electrode contacts the auxiliary drain electrode via a second pixel contact hole exposing the auxiliary drain electrode penetrating the planar layer.

2. The display according to claim 1, wherein the auxiliary drain electrode includes:
    the second metal layer; and
    the first metal layer disposed under the second metal layer around the first pixel contact hole.

3. The display according to the claim 1, wherein the second thin film transistor is a switching element for selecting a pixel, and
    wherein the first thin film transistor is a driving element for supplying video data to the pixel selected by the second thin film transistor.

4. The display according to the claim 1, wherein the oxide layer has thickness of 3,000 Å at least, and
    wherein the nitride layer has thickness of 500 Å to 3,000 Å.

5. The display according to the claim 1, wherein the first semiconductor layer includes a polycrystalline semiconductor material;
    a gate insulating layer covers the first semiconductor layer;
    the first gate electrode overlaps with the first semiconductor layer on the gate insulating layer;
    the second gate electrode is disposed on the gate insulating layer;

an intermediate insulating layer covers the first gate electrode and the second gate electrode;

the second semiconductor layer includes an oxide semiconductor material and is disposed with the second gate electrode on the intermediate insulating layer;

the first source electrode and the first drain electrode are disposed on the intermediate insulating layer; and the second source electrode and the second drain electrode are disposed on the second semiconductor layer;

the first thin film transistor includes the first semiconductor layer, the first gate electrode, the first source electrode and the first drain electrode; and the second thin film transistor includes the second semiconductor layer, the second gate electrode, the second source electrode and the second drain electrode.

6. The display according to the claim 5, wherein the intermediate insulating layer includes:

a nitride layer; and an oxide layer on the nitride layer.

* * * * *